United States Patent
Christie

(10) Patent No.: US 9,711,335 B2
(45) Date of Patent: Jul. 18, 2017

(54) SYSTEM AND METHOD FOR BALANCING CONSUMPTION OF TARGETS IN PULSED DUAL MAGNETRON SPUTTERING (DMS) PROCESSES

(71) Applicant: Advanced Energy Industries, Inc., Fort Collins, CO (US)

(72) Inventor: David Christie, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 485 days.

(21) Appl. No.: 14/333,407

(22) Filed: Jul. 16, 2014

(65) Prior Publication Data

US 2015/0021167 A1     Jan. 22, 2015

Related U.S. Application Data

(60) Provisional application No. 61/847,498, filed on Jul. 17, 2013.

(51) Int. Cl.
   *C23C 14/35*     (2006.01)
   *H01J 37/34*     (2006.01)
   (Continued)

(52) U.S. Cl.
   CPC ...... *H01J 37/3405* (2013.01); *C23C 14/0042* (2013.01); *C23C 14/3464* (2013.01);
   (Continued)

(58) Field of Classification Search
   CPC ............ C23C 14/0042; C23C 14/3464; C23C 14/3485; C23C 14/35; C23C 14/54;
   (Continued)

(56) References Cited

U.S. PATENT DOCUMENTS 5,169,509 A     12/1992 Latz et al.
2004/0262156 A1     12/2004 Seymour et al.
(Continued)

FOREIGN PATENT DOCUMENTS

DE     19703791 A1     2/1997

OTHER PUBLICATIONS

Baharlou, Simin, "International Preliminary Report on Patentability re Application No. PCT/US2014/046906", Jan. 19, 2016, Published in: EP.

(Continued)

*Primary Examiner* — Rodney McDonald
(74) *Attorney, Agent, or Firm* — Neugeboren O'Dowd PC

(57) ABSTRACT

A sputtering system and method are disclosed. The system has at least one dual magnetron pair having a first magnetron and a second magnetron, each magnetron configured to support target material. The system also has a DMS component having a DC power source in connection with switching components and voltage sensors. The DMS component is configured to independently control an application of power to each of the magnetrons, and to provide measurements of voltages at each of the magnetrons. The system also has one or more actuators configured to control the voltages at each of the magnetrons using the measurements provided by the DMS component. The DMS component and the one or more actuators are configured to balance the consumption of the target material by controlling the power and the voltage applied to each of the magnetrons, in response to the measurements of voltages at each of the magnetrons.

14 Claims, 7 Drawing Sheets

(51) Int. Cl.
*H01J 37/32* (2006.01)
*C23C 14/00* (2006.01)
*C23C 14/34* (2006.01)
*C23C 14/54* (2006.01)

(52) U.S. Cl.
CPC .......... *C23C 14/3485* (2013.01); *C23C 14/35* (2013.01); *C23C 14/54* (2013.01); *H01J 37/32027* (2013.01); *H01J 37/3299* (2013.01); *H01J 37/32935* (2013.01); *H01J 37/3417* (2013.01); *H01J 37/3438* (2013.01); *H01J 37/3444* (2013.01); *H01J 37/3464* (2013.01); *H01J 37/3467* (2013.01); *H01J 37/3479* (2013.01)

(58) Field of Classification Search
CPC ........... H01J 37/32027; H01J 37/32935; H01J 37/3299; H01J 37/3405; H01J 37/3417; H01J 37/3438; H01J 37/3444; H01J 37/3464; H01J 37/3467; H01J 37/3479

USPC .................................................. 204/298.08
See application file for complete search history.

(56) References Cited

U.S. PATENT DOCUMENTS

| 2010/0140083 | A1* | 6/2010 | Tietema .............. H01J 37/3299 204/298.03 |
| 2011/0081477 | A1 | 4/2011 | Nicolescu et al. |
| 2011/0258633 | A1 | 10/2011 | Matsumura |
| 2012/0193219 | A1 | 8/2012 | Linss |

OTHER PUBLICATIONS

Giel-Barragan Ramos, Cecilia, "International Search Report and Written Opinion re PCT/US2014/046906", Sep. 30, 2014, p. 11 Published in: NL.

* cited by examiner

SYSTEM AND METHOD FOR BALANCING CONSUMPTION OF TARGETS IN PULSED DUAL MAGNETRON SPUTTERING (DMS) PROCESSES

PRIORITY

This application claims priority to U.S. Provisional Appln. No. 61/847,498, filed on Jul. 17, 2013, entitled System and Method for Balancing Consumption of Targets in Pulsed Dual Magnetron Sputtering (DMS) Processes.

COPYRIGHT

A portion of the disclosure of this patent document contains material that is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The present invention relates generally to plasma-based sputtering, and more specifically to reactive sputtering.

BACKGROUND OF THE INVENTION

Reactive sputtering is performed in a magnetron sputtering system. The material sputtered from the magnetron is combined with a reactive gas at the substrate (item being coated) to form a compound at its surface. The reactive gas also reacts with the target surface, forming a compound there. These systems can operate open loop in either the metallic mode, where a small fraction of the target is covered with the compound, or the poisoned mode, where a large fraction of the target is covered with compound. In some cases, the compound has a sputtering yield much lower than the native target material. In fact, the sputtering yield for a target completely covered with reactive compound (poisoned) can be 10% or less that of the native target material. Because of this, it is desirable to run these processes in the transition mode, to achieve a higher deposition rate. The transition mode is typically inherently unstable, so feedback control is usually required to stabilize the process there. Feedback can be, for example, process voltage, reactive gas partial pressure, and optical emission from the target.

A common implementation of reactive sputtering is dual magnetron sputtering (DMS) shown in FIG. 1. A key advantage is the absence of explicit anodes, and the challenges that come with them. The two magnetrons alternate roles as cathode and anode. When a purpose built bipolar pulsed supply is used to drive the process, the power to each magnetron can be regulated individually. Fast read backs of power, voltage, and current for each magnetron can be provided to the user for use in monitoring and controlling the process.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

The present invention can provide a system and method for dual magnetron sputtering. According to one aspect, the present invention can include a sputtering system having at least one dual magnetron pair comprising a first magnetron and a second magnetron, each magnetron of the dual magnetron pair configured to support target material. The system may also include a DMS component having a DC power source in connection with a plurality of switching components and a plurality of voltage sensors, the DMS component configured to independently control an application of power to each of the magnetrons, and to provide measurements of voltages at each of the magnetrons. The system may also include one or more actuators configured to control the voltages at each of the magnetrons using the measurements provided by the DMS component. The DMS component and the one or more actuators balance the consumption of the target material by controlling the power and the voltage applied to each of the magnetrons in response to the measurements of voltages at each of the magnetrons.

According to another aspect, a method for sputtering is disclosed. The method may include arranging at least two magnetrons to form at least one dual magnetron pair and affixing target material to each of the at least two magnetrons. The target material is sputtered on to a substrate and consumption of the target material is balanced by balancing power and voltage that is applied to each of the at least two magnetrons.

According to another aspect, a DMS supply having switching components configured to receive DC power and apply pulsed-DC power to each of at least two magnetrons is disclosed. A control portion controls the switching components to balance an application of power to each of the at least two magnetrons, and voltage measurement components provide measurements of voltages at each of the magnetrons to enable actuators to control the application of voltages to the magnetrons.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following detailed description and to the appended claims when taken in conjunction with the accompanying drawings wherein:

DETAILED DESCRIPTION

Figure 1:
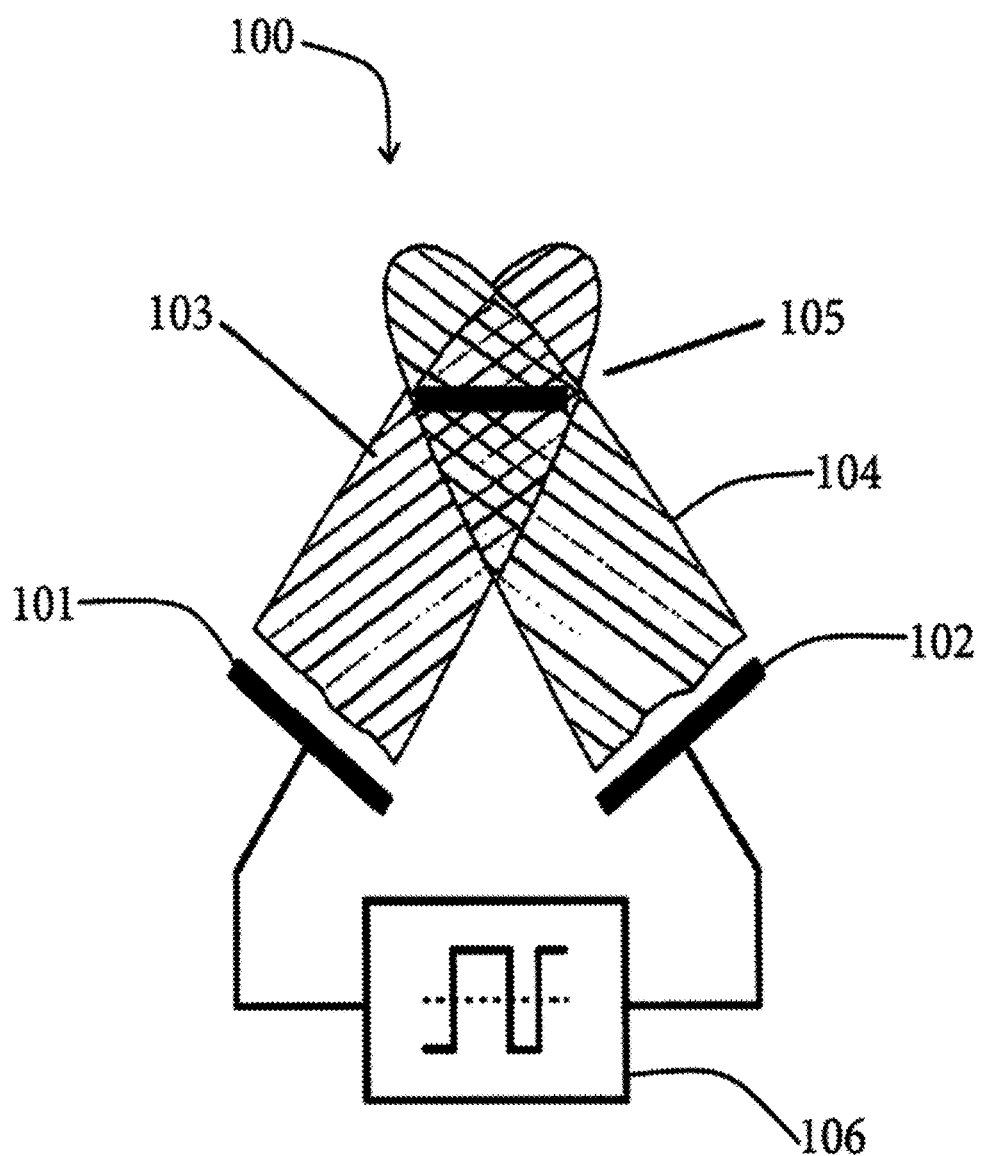
FIG. 1 illustrates a general arrangement of a sputtering system according to an embodiment.

In DMS systems, targets can end up with uneven consumption due to differences in reactive sputtering working point and differences in power delivered to each magnetron of the pair. To overcome this problem, and referring now to FIG. 1, the DMS disclosed herein includes a target A 101 having a first metal and target B 102 having a second metal exposed to a first reactive gas 103 and/or a second reactive gas 104, to cause a reaction leading to a material deposition on a substrate 105. A power supply 106, which may be a bipolar pulsed supply, applies alternating power to each of the targets 101, 102. In order to achieve fully balanced target consumption, it has been found that it is beneficial for both targets 101, 102 to be at substantially the same working point, and to deliver equal power to each target. As a consequence, in many embodiments, both the working point of the two targets and the power delivered to each of the targets 101, 102 is balanced.

In a pulsed dual magnetron system, it is possible to control the power delivered to each of the targets 101, 102 independently. For many practical reactively sputtered compounds, voltage is an excellent indicator of the fraction of the target surface covered with the reactive compound, and can be used as a feedback signal to control the process.

Figure 2:
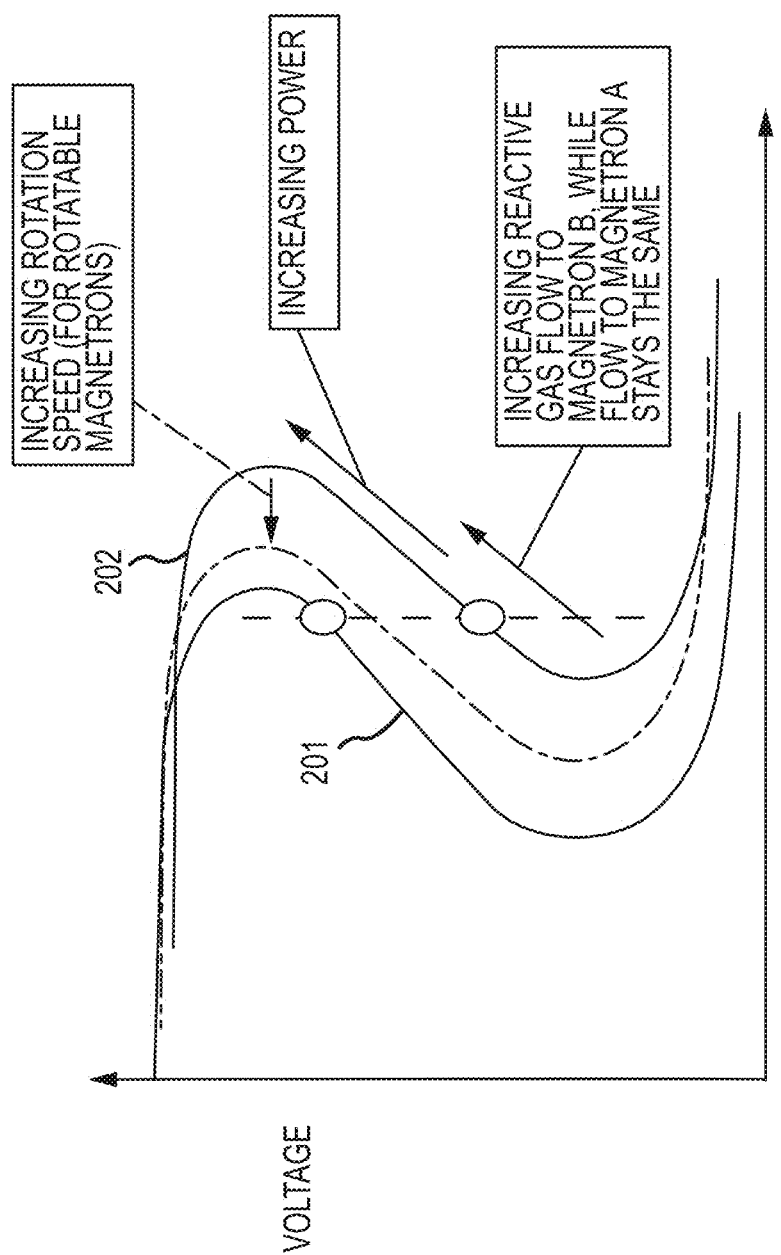
FIG. 2 graphically illustrates a relationship between voltage and reactive gas flow for two magnetrons.

Referring next to FIG. 2. It shows the voltage versus reactive gas flow control space of a dual magnetron system. A key point is that each magnetron has its own control curve, and they are different due to inevitable asymmetries in the hardware. As seen in FIG. 2, curve 201 relates to a control curve for, for example, a magnetron associated with target A 101, while control curve 202 relates to a control curve for, for example, another magnetron associated with target B 102. For a given reactive gas flow, and with identical power delivered to each magnetron, the voltage is different. This indicates a different fraction of the target covered with compound, and a different target material removal rate for each target.

The highest performance strategy to match the target material removal rate for each magnetron would match the burning voltage of each magnetron as well as the power to each magnetron. In this case, there are two things to be controlled, so two actuators are required. Power balance can be achieved explicitly by the pulsed power supply. Voltage balance can be achieved by modifying the flow of reactive gas to one magnetron relative to the other by using, for example, a secondary gas manifold and/or means of controlling gas flow (e.g., means for controlling mass flow rate). When rotatable magnetrons are used, it is also possible to move the transition curve to the left by increasing the rotation speed, as shown in FIG. 2 (see for example, *Reactive Sputter Deposition*, Section 5.5.3 on rotating magnetrons, edited by Depla and Mahieu, Springer, 2008).

In cases where a second actuator is not available, there are two clear possibilities. The first is to simply balance the power delivered to each magnetron. The second is to match the voltage of the two magnetrons, and accept the power imbalance. This may actually result in the minimum difference in target material removal rate, since it can be such a strong function of voltage. With a fast read back of the power delivered to each magnetron, it is possible to monitor the power imbalance, and predict the mismatch in target consumption.

Figure 3:
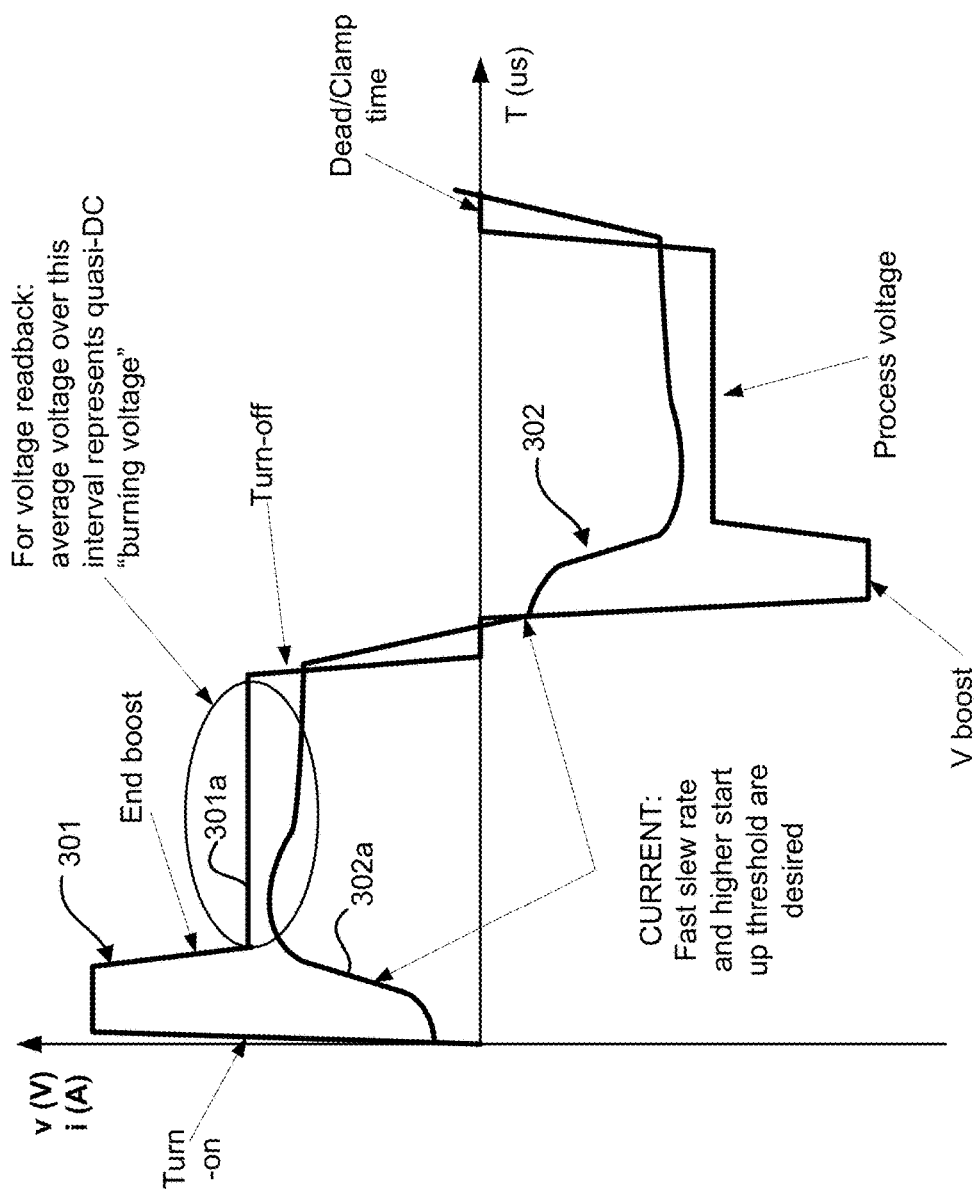
FIG. 3 illustrates a relationship between voltage and current over a period of time.

A waveform for driving pulsed DMS arrangements is shown in FIG. 3. Here, the waveform interval to be averaged for fast voltage feedback is defined. More specifically, the voltage 301 in the encircled flat line interval 301a reflects a quasi-DC burning voltage of the magnetron, and as such is a good indicator of the fraction of the target surface of, for example, target 101, 102 covered with the reactive compound, and therefore, the sputtering yield of the target surface.

It should also be noted that, as seen in FIG. 3, the changes in current are also tracked and controlled. First, a fast current slew rate and higher start up threshold at the beginning of the cycle are desired. This provides an approximation of a current source, which is beneficial for driving magnetron sputtering processes in a quasi-DC mode.

Figure 4:
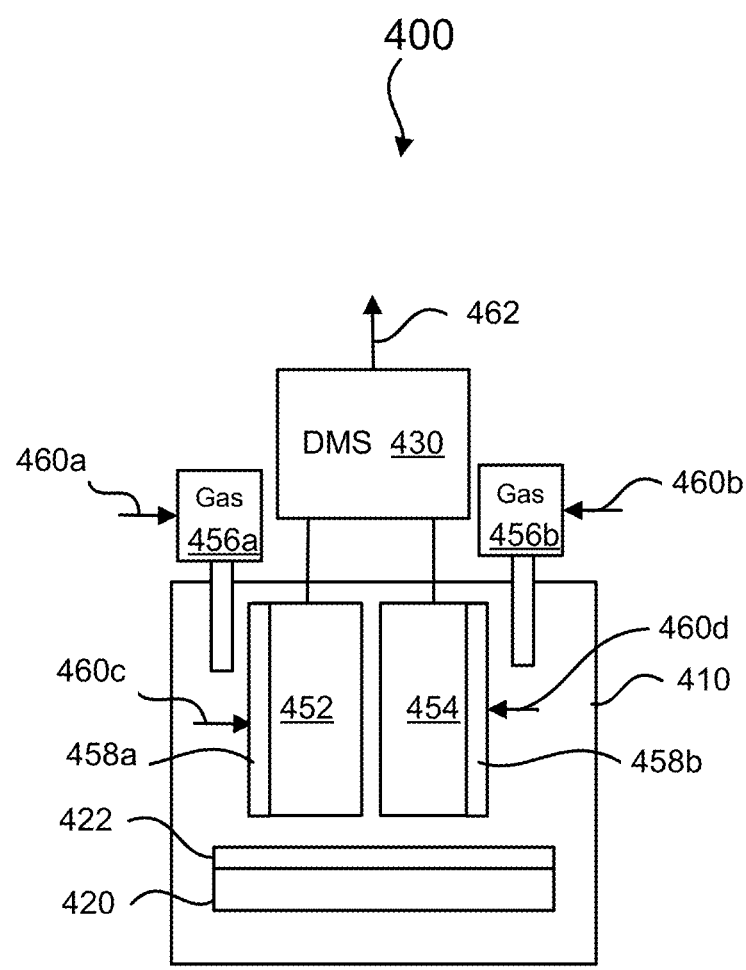
FIG. 4 illustrates a schematic of an embodiment of a DMS system.

Referring next to FIG. 4, is a schematic block diagram that illustrates a sputtering system 400 having a plasma sputtering chamber 410 configured to receive DC pulses applied by a DMS component 430 for causing a substrate 420 to receive a compound 422 formed at the surface of the substrate 420, according to an embodiment. In many implementations, the DMS component 430 is configured to modify DC power pulses (e.g., consistent with FIG. 3) delivered to the magnetrons 452, 454 independently to balance an application of power to the magnetrons 452, 454. In addition, the DMS component 430 measures a voltage at each of the magnetrons 452, 454 to enable a voltage that is applied to the each of the magnetrons 452, 454 to be controlled using one or more actuators (e.g., mass flow controllers 456a, 456b and rotation controllers 458a, 458b). By independently controlling the application of power (using the switched power of the DMS component 430) and the voltage at each of the magnetrons 452, 454 (using one or more of the actuators 456a, 456b, 458a, 458b) the consumption of target material on each magnetron may be balanced. Although rotation controllers 458a, 458b are depicted in this embodiment, this is certainly not required. As discussed above, not all magnetrons are enabled with rotational capability, and the operating voltage of each of the magnetrons 452, 454 may be varied by control of reactive gas flow.

The DMS component 430 may be realized by a DC power source in connection with switching components to apply power to each of the magnetrons 452, 454 as discussed above, and voltage sensors known to those of ordinary skill in the art may be utilized to provide feedback in the control of the actuators. U.S. Pat. No. 5,917,286 entitled Pulsed Direct Current Power Supply Configurations for Generating Plasmas and U.S. patent application No. 20110248633 entitled Methods and Apparatus for Applying Periodic Voltage Using Direct Current, both of which are incorporated herein by reference, disclose exemplary components that may be used, in part, to realize the DMS component 430. In addition, control logic, which may be realized by hardware, or software in connection with hardware, may be utilized to control the switching components and generate control signals based upon the feedback from voltage sensors.

In some variations of the embodiment depicted in FIG. 4, the DMS component 430 may provide control signals 460a-d to control the actuators 456a, 456b, 458a, 458b. But in other embodiments the DMS component 430 provides one or more outputs 462 that include voltage measurement information that may be used by an external controller to generate the control signals 460a-d.

As discussed above, voltage balance can be achieved by modifying the flow of reactive gas 456a, 456b to one magnetron relative to the other, by using secondary gas manifolds and gas flow control means (known to those of ordinary skill in the art) of controlling gas flow. And when rotatable magnetrons are used, it is also possible to move the transition curve to the left by increasing the rotation speed, as shown in FIG. 2.

Figure 5:
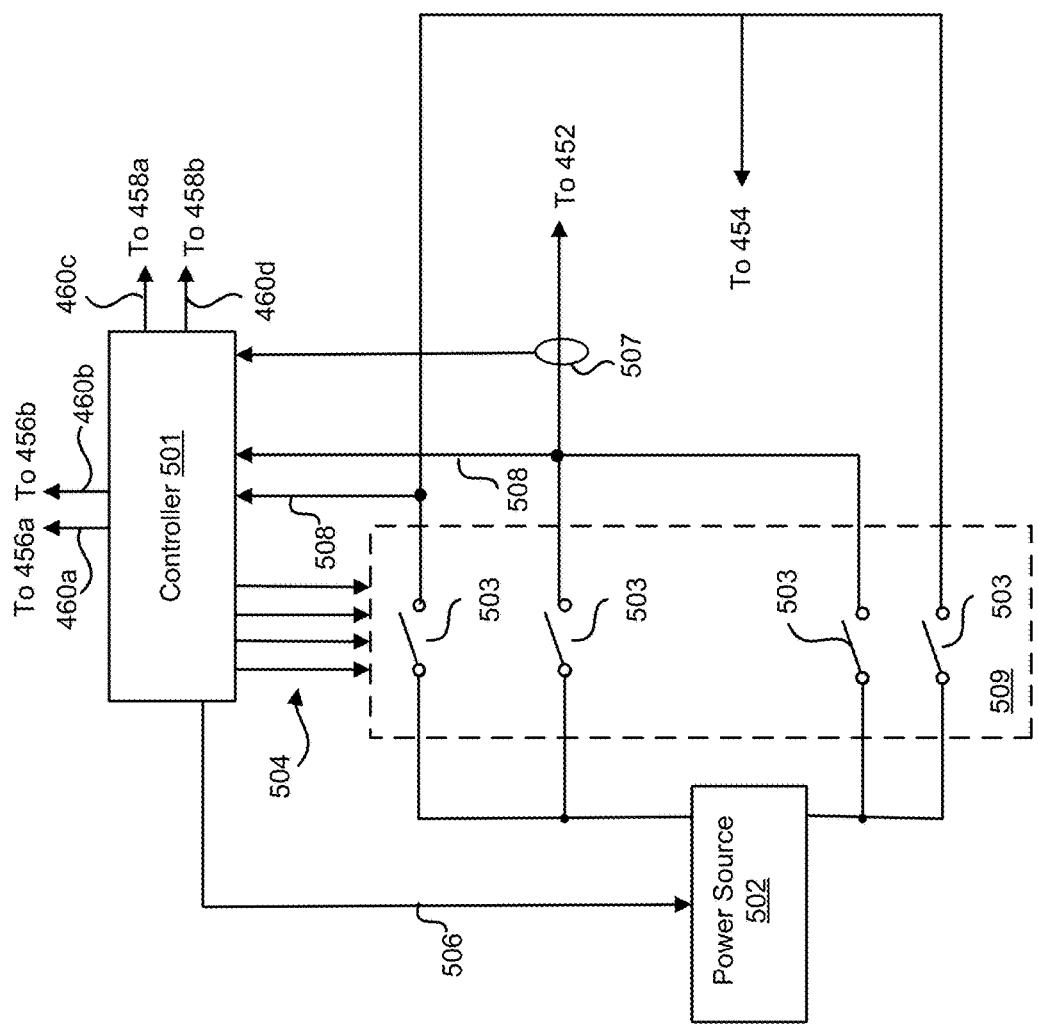
FIG. 5 illustrates a schematic of one embodiment of a DMS component and system interface.

Turning now to FIG. 5, shown are components that may be utilized to realize the DMS component 430. As shown, a controller 501 is operatively coupled to a power source 502 with a control signal 506 and a plurality of switching components 503 with switching control signals 504. The controller 501 in this embodiment generates the switching control signals 504 to operate the switching components 503 (which may be implemented in an H-bridge configuration). The controller also provides mass flow control signals 460a, 460b (to control the mass flow controllers 456a, 456b) and rotation control signals 460c, 460d (to control the rotation controllers 458a, 458b). As shown, the controller 501 receives feedback from at least one current transducer 507 and voltage pickups 508 to receive an indication of the current and voltage at the electrodes or magnetrons 452, 454. The signals 504, 460a, 460b, 460c, 460d, 506 are generated in response to the feedback from the sensed current and sensed voltage. In some embodiments, the switching components 503 may be configured and controlled as disclosed in U.S. patent application. Ser. No. 13/104,942 or U.S. Pat. No. 8,391,025, the disclosures of which are incorporated herein by reference.

Referring now to FIG. 3 alongside FIG. 5, the controller 501 generates signals 504, 506 that, taken together, control the voltage 301 and current 302 applied, and the average voltage read back over the interval 301a between an end boost and a turn-off represents a quasi-DC burning voltage. As discussed, the interval 301a, as well as the voltage 301 and current 302 may be controlled to balance the consumption of target material.

The controller 501 may be implemented or performed in part with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in processor executable instructions encoded in non-transitory processor readable medium, or in a combination of the two. A software module (including non-transitory processor executable instructions) may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Figure 6:
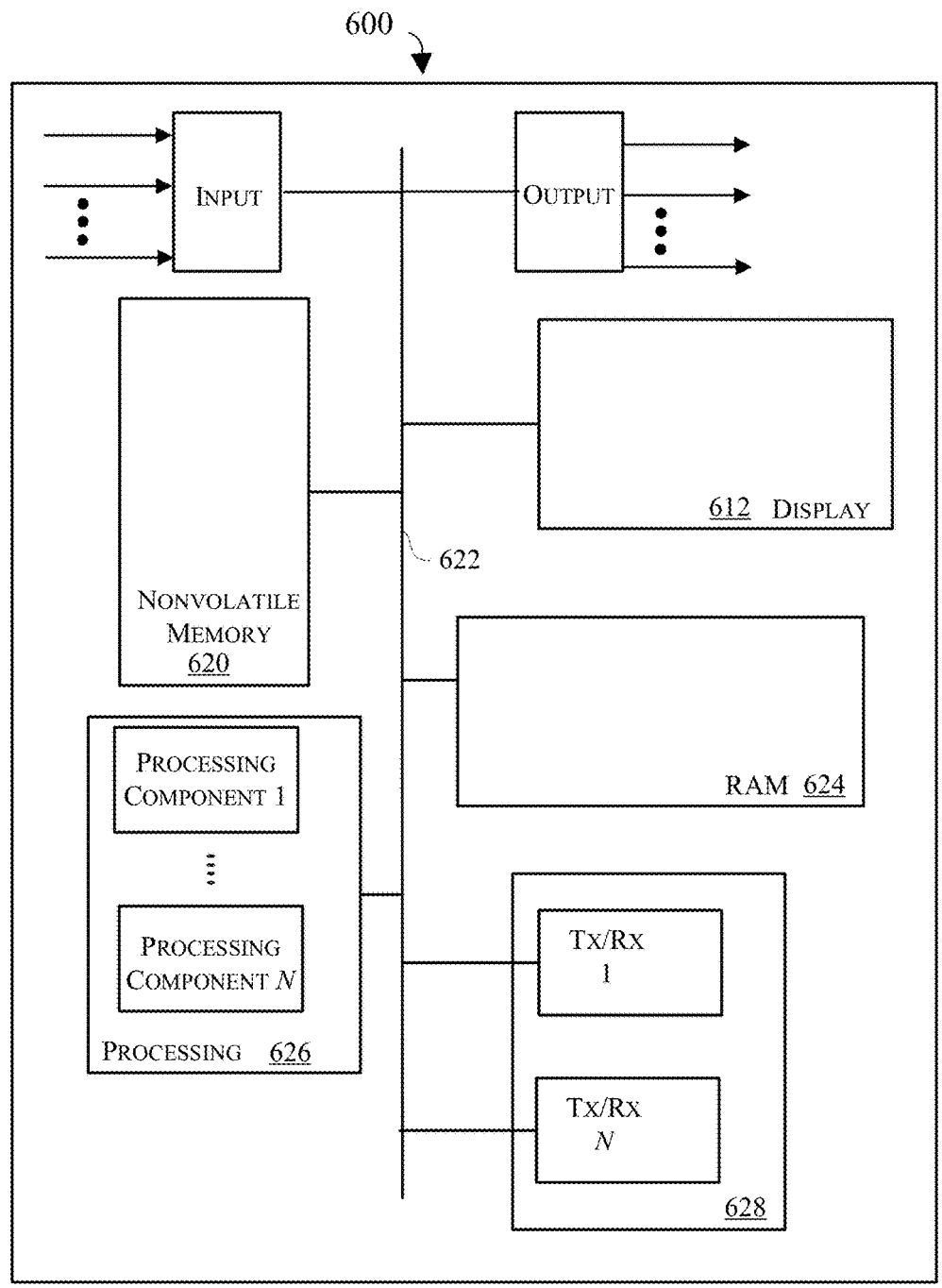
FIG. 6 is a block diagram depicting physical components of an exemplary computing device.

Referring next to FIG. 6, shown is a block diagram depicting physical components that may be utilized to realize the controller 501 according to an exemplary embodiment. As shown, in this embodiment a display portion 612 and nonvolatile memory 620 are coupled to a bus 622 that is also coupled to random access memory ("RAM") 624, a processing portion (which includes N processing components) 626, and a transceiver component 628 that includes N transceivers. Although the components depicted in FIG. 6 represent physical components, FIG. 6 is not intended to be a detailed hardware diagram; thus many of the components depicted in FIG. 6 may be realized by common constructs or distributed among additional physical components. Moreover, it is contemplated that other existing and yet-to-be developed physical components and architectures may be utilized to implement the functional components described with reference to FIG. 6.

This display portion 612 generally operates to provide a user interface for a user, and in several implementations, the display is realized by a touchscreen display. In general, the nonvolatile memory 620 is non-transitory memory that functions to store (e.g., persistently store) data and processor executable code (including executable code that is associated with effectuating the methods described herein). In some embodiments for example, the nonvolatile memory 620 includes bootloader code, operating system code, file system code, and non-transitory processor-executable code to facilitate the execution of a method described with reference to FIG. 7 described further herein.

In many implementations, the nonvolatile memory 620 is realized by flash memory (e.g., NAND or ONENAND memory), but it is contemplated that other memory types may be utilized as well. Although it may be possible to execute the code from the nonvolatile memory 620, the executable code in the nonvolatile memory 620 is typically loaded into RAM 624 and executed by one or more of the N processing components in the processing portion 626.

The N processing components in connection with RAM 624 generally operate to execute the instructions stored in nonvolatile memory 620 to effectuate a balanced consumption of target material. For example, non-transitory processor-executable instructions to effectuate the methods described with reference to FIGS. 1 through 4 and 6 may be persistently stored in nonvolatile memory 620 and executed by the N processing components in connection with RAM 624. As one of ordinarily skill in the art will appreciate, the processing portion 626 may include a video processor, digital signal processor (DSP), graphics processing unit (GPU), and other processing components.

The input component operates to receive signals that are indicative of the consumption of a first target material and a second target material, which may include measurements of voltages at each magnetron in a dual magnetron system. The input component may also receive signals (e.g., from the current transducers 107) that are indicative of the current provided to the magnetrons 452, 454. And the output component may operate to provide the signals 460a, 460b, 460c, 460d, 504, 506 as discussed above.

The depicted transceiver component 628 includes N transceiver chains, which may be used for communicating with external devices via wireless networks. Each of the N transceiver chains may represent a transceiver associated with a particular communication scheme.

Figure 7:
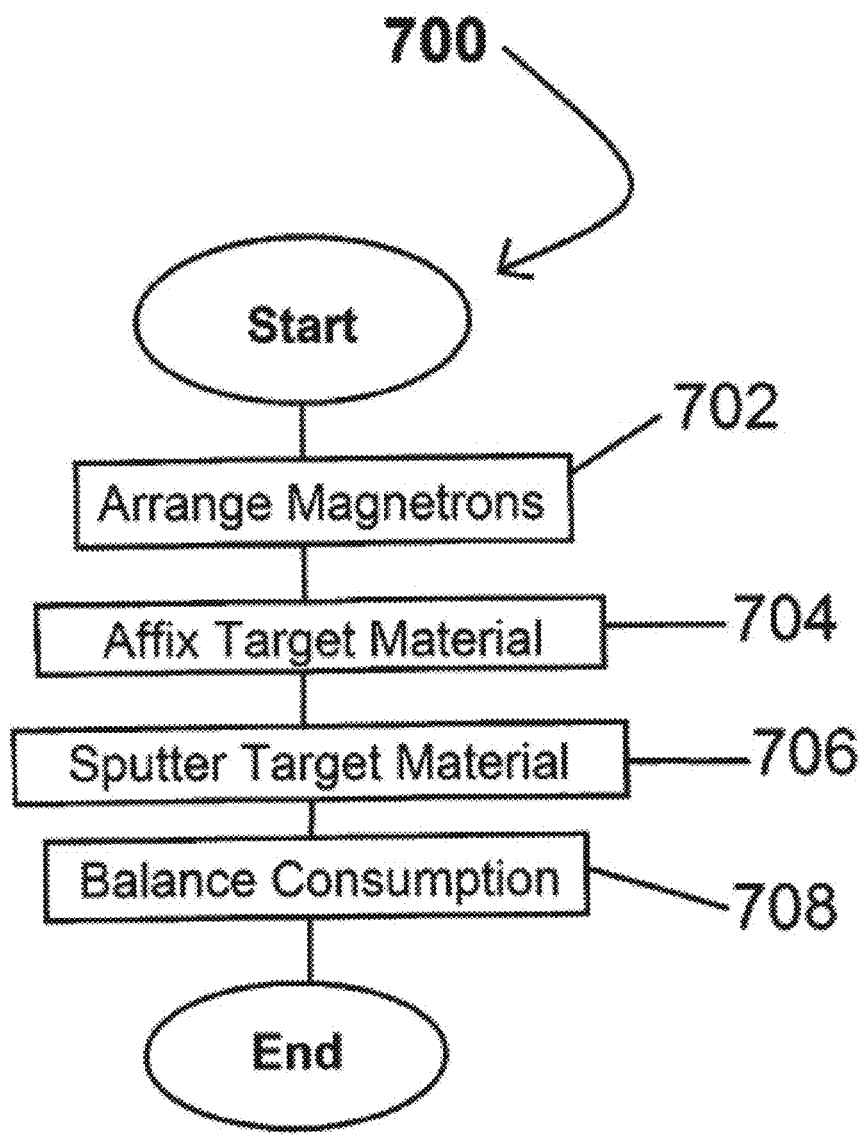
FIG. 7 is a flow diagram depicting an exemplary method.

Turning now to FIG. 7, a method 700 according to one embodiment is described. The method 700 includes arranging 702 at least two magnetrons to form at least one dual magnetron pair, affixing 704 target material to each of the at least two magnetrons, sputtering 706 the target material on to a substrate, and balancing 708 consumption of the target material by balancing both the power and voltage that are applied to each of the at least two magnetrons. The method 700 may be achieved using the embodiments described herein with reference to FIGS. 1-6. The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A sputtering system comprising:
   at least one dual magnetron pair comprising a first magnetron and a second magnetron, each magnetron of the dual magnetron pair configured to support target material;
   a dual magnetron sputtering (DMS) component comprising a DC power source in connection with a plurality of switching components and a plurality of voltage sensors, the DMS component configured to independently control an application of power to each of the magnetrons, and to provide measurements of voltages at each of the magnetrons; and
   one or more actuators configured to control the voltages at each of the magnetrons using the measurements provided by the DMS component;
   wherein the DMS component and the one or more actuators are configured to balance the consumption of the target material by controlling the power and the voltage applied to each of the magnetrons, in response to the measurements of voltages at each of the magnetrons.

2. The system of claim 1, wherein the one or more actuators include one or more of:
   gas flow control means to control the flow of reactive gas to one magnetron relative to the other magnetron; and
   rotation components to control the rotation speed of each magnetron.

3. The sputtering system of claim 1, comprising:
   at least one stationary substrate.

4. The sputtering system of claim 1, comprising:
   at least one secondary gas manifold; and
   at least one gas flow controller; wherein
   the at least one secondary gas manifold and the at least one gas flow controller are configured to modify a flow of a reactive gas to one magnetron relative to a flow of a reactive gas to the other magnetron.

5. The sputtering system of claim 1, wherein:
   the DMS component is configured to match a first burning voltage of the first magnetron to a second burning voltage of the second magnetron.

6. The sputtering system of claim 5, wherein:
   the DMS component is configured to calculate the first burning voltage based on an average voltage of the first magnetron measured between a first end boost period and a first turn-off period; and
   the DMS component is configured to calculate the second burning voltage based on an average voltage of the second magnetron measured between a second end boost period and a second turn-off period.

7. The sputtering system of claim 5, wherein:
   the DMS component is configured to calculate a process voltage.

8. The sputtering system of claim 1, wherein:
   the DMS component is configured to modify the flow of reactive gas to the second magnetron relative to the first magnetron.

9. The sputtering system of claim 1, wherein:
   the DMS component is configured to adjust a rotation speed of at least one of the first magnetron and the second magnetron.

10. The sputtering system of claim 1, comprising:
    switching components configured to receive DC power and apply pulsed-DC power to each of the first magnetron and the second magnetron;
    voltage measurement components to provide measurements of voltages at each of the magnetrons to enable the actuators to control the application of voltages to the magnetrons; and wherein
    the DMS component is configured to control the switching components to balance an application of power to each of the at least two magnetrons.

11. A dual magnetron sputtering (DMS) supply comprising:
    switching components configured to receive DC power and apply pulsed-DC power to each of at least two magnetrons;
    a control portion configured to control the switching components to balance an application of power to each of the at least two magnetrons; and
    voltage measurement components to provide measurements of voltages at each of the magnetrons to enable actuators to control the application of voltages to the magnetrons.

12. The DMS supply of claim 11 including:
    a DC supply to provide the DC power.

13. The DMS supply of claim 12 including:
    control outputs to provide control signals to one or more actuators based upon the measurements of voltages.

14. The DMS supply of claim 13, wherein the control outputs include one or more of:
    a control output to control a gas flow controller that controls a flow of reactive gas to one magnetron relative to the other magnetron; and
    a control output to control a rotation speed of at least one of the magnetrons.

* * * * *